(12) United States Patent
Biebuyck et al.

(10) Patent No.: US 6,337,381 B1
(45) Date of Patent: Jan. 8, 2002

(54) SILOXANE AND SILOXANE DERIVATIVES AS ENCAPSULANTS FOR ORGANIC LIGHT EMITTING DEVICES

(75) Inventors: Hans Biebuyck, Thalwil; Eliav Haskal, Zurich, both of (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/154,620

(22) Filed: Sep. 16, 1998

Related U.S. Application Data

(62) Division of application No. 08/747,791, filed on Nov. 14, 1996, now Pat. No. 5,855,994.

(30) Foreign Application Priority Data

Jul. 10, 1996 (WO) .................................. PCT/IB96/00066

(51) Int. Cl.$^7$ .............................................. C08G 77/06
(52) U.S. Cl. .......................... 528/12; 257/100; 313/503; 313/504; 313/505; 313/506; 428/195; 428/209; 428/690; 428/917; 528/10; 528/31
(58) Field of Search .................................. 313/503, 504, 313/505, 506; 428/209, 690, 917, 195; 528/31, 12, 10; 257/100

(56) References Cited

U.S. PATENT DOCUMENTS 4,125,510 A * 11/1978 Antonen ........................ 528/27
5,063,102 A * 11/1991 Lee et al. ..................... 428/901

* cited by examiner

*Primary Examiner*—John M. Cooney, Jr.
(74) *Attorney, Agent, or Firm*—Ohlandt, Greeley, Ruggiero & Perle LLP; Daniel P. Morris

(57) ABSTRACT

An organic light emitting device (10) is provided which is encapsulated by a Siloxane film (17). This Siloxane film (17) is applied to the light emitting portion of the diode (10) providing for protection against contamination, degradation, oxidation and the like. The Siloxane film (17) carries an optical element, such as a lens (18) for example. This optical element (18) is arranged such that the light generated inside the diode (10) is output through it.

7 Claims, 4 Drawing Sheets

SILOXANE AND SILOXANE DERIVATIVES AS ENCAPSULANTS FOR ORGANIC LIGHT EMITTING DEVICES

This application is a Divisional of Ser. No. 08/747,791 filed Nov. 14, 1996, which is now U.S. Pat. No. 5,855,944, which is a 371 of PCT/IB96/00066 filed Jul. 10, 1996.

TECHNICAL FIELD

The present invention pertains to organic electroluminescent devices, such as discrete light emitting devices, arrays, displays, and in particular to the encapsulation of these devices. It furthermore relates to a method for encapsulating the same.

BACKGROUND OF THE INVENTION

Organic electroluminescence (EL) has been studied extensively because of its possible applications in discrete light emitting devices, arrays and displays. Organic materials investigated so far can potentially replace conventional inorganic materials in many applications and enable wholly new applications. The ease of fabrication and extremely high degrees of freedom in organic EL device synthesis promises even more efficient and durable materials in the near future which can capitalize on further improvements in device architecture.

Organic EL light emitting devices (OLEDs) function much like inorganic LEDs. Depending on the actual design, light is either extracted through a transparent electrode deposited on a transparent glass substrate, or through a transparent top electrode. The first OLEDs were very simple in that they comprised only a two to three layers. Recent development led to organic light emitting devices having many different layers (known as multilayer devices) each of which being optimized for a specific task.

With such multilayer device architectures now employed, a performance limitation of OLEDs is the reliability. It has been demonstrated that some of the organic materials are very sensitive to contamination, oxidation and humidity. Furthermore, most of the metals used as contact electrodes for OLEDs are susceptible to corrosion in air or other oxygen containing environments. A Ca cathode, for example, survives intact only a short time in air, leading to rapid device degradation. It is also likely that such highly reactive metals undergo a chemical reaction with the nearby organic materials which also could have negative effects on device performance. A low work function cathode metal approach requires careful handling of the device to avoid contamination of the cathode metal, and immediate, high quality encapsulation of the device if operation in a normal atmosphere is desired. Even well encapsulated low work function metal contacts are subject to degradation resulting from naturally evolved gases, impurities, solvents from the organic LED materials.

Many approaches have been attempted in order to solve the problem of electrode instability and degradation. A common approach is the use of a low work function metal subsequently buried under a thicker metal coating. In this case, pinholes in the metal still provide ample pathways for oxygen and water to reach the reactive metal below, as is described in Y. Sato et al., "Stability of organic electroluminescent diodes", Molecular Crystals and Liquid Crystals, Vol. 253, 1994, pp. 143–150, for example.

The overall lifetime of current organic light emitting devices is limited. The lack of inert, stable, and transparent encapsulants for stable OLED operation remains a major obstacle to OLED development.

Organic LEDs have great potential to outperform conventional inorganic LEDs in many applications. One important advantage of OLEDs and devices based thereon is the price since they can be deposited on large, inexpensive glass substrates, or a wide range of other inexpensive transparent, semitransparent or even opaque crystalline or non-crystalline substrates at low temperature, rather than on expensive crystalline substrates of limited area at comparatively higher growth temperatures (as is the case for inorganic LEDs). The substrates may even be flexible enabling pliant OLEDs and new types of displays. To date, the performance of OLEDs and devices based thereon is inferior to inorganic ones for several reasons:

1. High operating current: Organic devices require more current to transport the required charge to the active region (emission layer) which in turn lowers the power efficiency of such devices.
2. Reliability: Organic LEDs degrade in air and during operation. Several problems are known to contribute. A) Efficient low field electron injection requires low work function cathode metals like Mg, Ca, Li etc. which are all highly reactive in oxygen and water. Ambient gases and impurities coming out of the organic materials degrade the contacts. B) Conventional AgMg and ITO contacts still have a significant barrier to carrier injection in preferred ETL and HTL materials, respectively. Therefore, a high electric field is needed to produce significant injection current.
3. Poor chemical stability: Organic materials commonly used in OLEDs are vulnerable to degradation caused by the ambient atmosphere, diffusion of contact electrode material, interdiffusion of organics, and reactions of organics with electrode materials.

As can be seen from the above description there is a need for simple and efficient encapsulation of organic light emitting devices. It is a further problem of light emitting devices in general, that a light path for emission of the light generated is to be provided.

It is an object of the present invention to provide a simple and cheap encapsulation of organic light emitting devices.

It is a further object of the present invention to provide new and improved organic EL devices, arrays and displays based thereon with improved stability and reliability.

It is a further object to provide a method for making the present new and improved organic EL devices, arrays and displays.

SUMMARY OF THE INVENTION

The invention as claimed is intended to improve the reliability of known organic light emitting devices. The above objects have been accomplished by providing a transparent Siloxane or Siloxane derivative encapsulation for an organic light emitting device. The encapsulant comprises an optical element being arranged such that it lies within the light path of the light emitted by said organic light emitting device. Examples of optical elements that may be formed in, or embedded by the encapsulant are: lenses, filters, color converters, gratings, prisms and the like.

The present invention builds on the finding that Siloxanes and Siloxane derivatives are well suited for use in direct contact with the organic materials used for making organic light emitting devices. This is in contrast to currently accepted OLED technology, where no material is allowed to come into direct contact with the organic device. Current OLEDs are protected by 'mechanical' sealing, e.g. using an appropriate housing and sealing means.

In contrast to conventional approaches, the encapsulant is also allowed to cover the light emitting portion(s), or part thereof. It turned out that Siloxanes and Siloxane derivatives do not seem to have a detrimental impact on the behavior and lifetime of the light emitting portion of organic devices.

The Siloxanes and Siloxane derivatives form a transparent and non-reactive seal which makes conformal contact with the organic devices. It provides for an excellent barrier to external contamination, such as water, solvent, dust and the like. The proposed encapsulant also protects against corrosion of the highly reactive metal electrodes (e.g. calcium, magnesium, lithium) used in OLED devices. It is non-conductive, which is of particular importance in case that metal electrodes are also embedded in the encapsulant.

Furthermore, Siloxane and Siloxane derivatives are extremely robust and stable. They are unlikely to react with the organic devices even in high-driving, high-heating conditions. Even close to the light emitting portion(s) of OLEDs, where usually the power density has its maximum, no reaction with the present encapsulant takes place.

It is another important feature of Siloxane and Siloxane derivatives that it forms a conformal contact with the underlying organic material such that no air, solvent, or water is trapped. Due to this, the lifetime of the organic device is extended.

Further advantages of the Siloxane and Siloxane derivative encapsulation will be addressed in connection with the embodiments of the present invention.

DESCRIPTION OF THE DRAWINGS

The invention is described in detail below with reference to the following schematic drawings (it is to be noted that the drawings are not drawn to scale).

GENERAL DESCRIPTION

Figure 1:
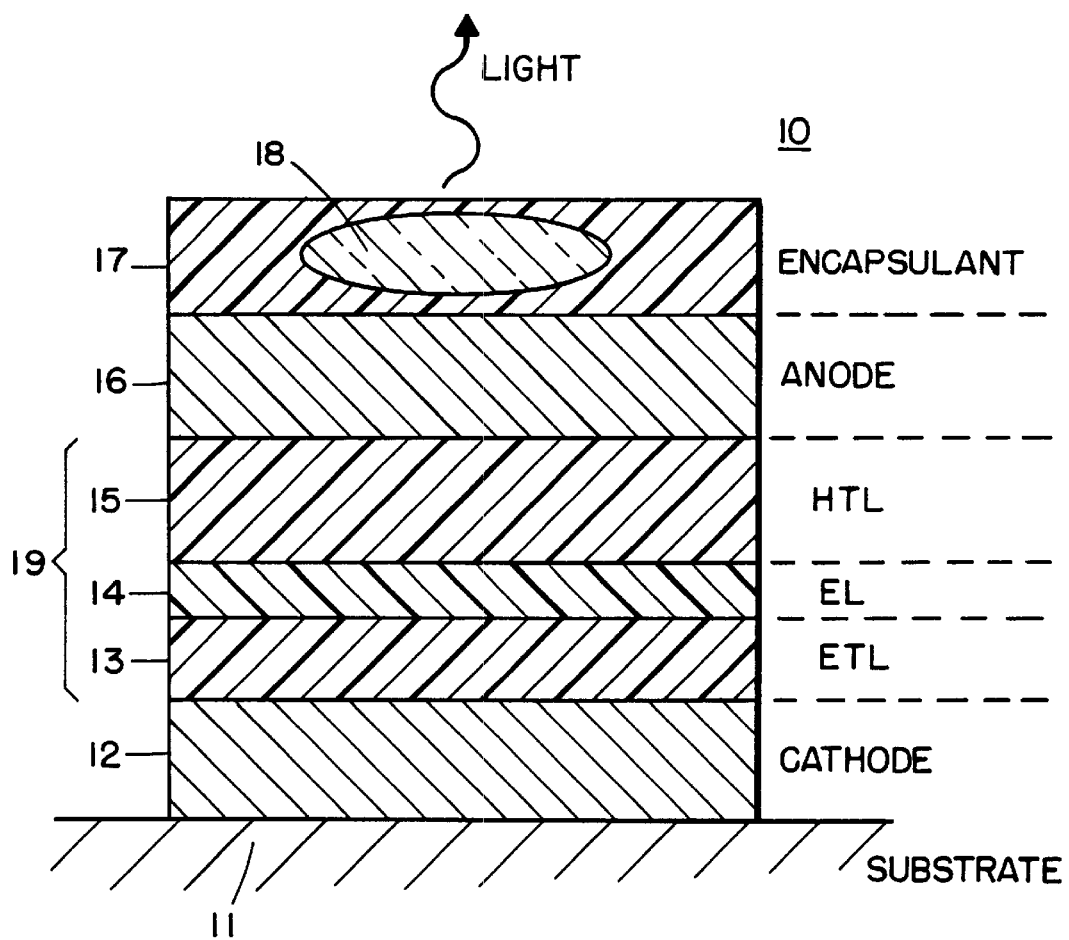
FIG. 1 shows a schematic cross-section of a discrete organic light emitting device being protected by a Siloxane encapsulant comprising an optical element, according to the present invention.

Silicone molding compounds have been known for more than twenty years and their uses include, among others, the encapsulation of electrical and electronic devices. In particular Siloxane, a silicone resin, is widely used for the molding of electronic devices, such as integrated circuits, and the coating of portions of such devices. Typical examples of Siloxanes are composed of copolymers or blends of copolymers of any combination of monophenylsiloxane units, diphenylsiloxane units, phenylmethylsiloxane units, dimethylsiloxane units, monomethylsiloxane units, vinylsiloxane units, phenylvinylsiloxane units, methylvinylsiloxane units, ethylsiloxane units, phenylethylsiloxane units, ethylmethylsiloxane units, ethylvinylsiloxane units, or diethylsiloxane units.

Depending on the resin composition, the properties of Siloxane can be altered. Some aspects to be taken into account are: stability against crack formation, moisture resistance, coefficient of thermal expansion, elastic modulus and crosslinking methods. Siloxanes that cross link by the hydrosiliation reaction provide a particularly useful subset of Siloxane. Siloxanes allowing crosslinking on their exposure to light, are also preferred as when the Siloxane prepolymer contains vinyl or acetylenic groups and a light activated radical initiator, for example.

Examples of Siloxanes and Siloxane derivatives suited as encapsulants for organic light emitting devices are those given in U.S. Pat. Nos. 4,125,510, 4,405,208, 4,701,482, 4,847,120, 5,063,102 and 5,213,864, 5,260,398, 5,300,591, and 5,420,213, for example. It is important to chose a Siloxane which is transparent in the wavelength range of the light emitted by the OLED to be encapsulated. In the following, the word Siloxane is used as a synonym for all different kinds of transparent Siloxanes. Other materials can be cured with the Siloxane to further enhance a material property. Thus mixtures of two polymers can provide enhancement of the device performance as when one component of the encapsulant contains an oxygen scavenger like an organoplatinum complex or Titanium, or a free radical scavenger like tert butanol or some similar molecule. Alternatively, the Siloxane also provides a useful passivation layer for transfer of a second polymer layer, especially where the latter requires an aggressive solvent that would otherwise attack the device, but is effectively blocked by the Siloxane. This second layer can further improve performance by preventing passive or active diffusion of gases through to the OLED.

In order to avoid contamination of the organic stack of the OLED to be encapsulated, or to prevent metal electrodes from corrosion, it turned out to be important to have an encapsulant which makes conformal contact with the devices. Furthermore, it is important that the OLED can be encapsulated without having to heat the OLED or without having to treat it with aggressive chemicals.

Siloxane and Siloxane derivatives can be molded into shapes that can be put on the OLED easily. Due to the elastic properties of Siloxane, it easily conforms to the OLED surface. It is possible, to roll a pre-fabricated Siloxane film onto the OLED. It is an interesting property of Siloxane, that several films of Siloxane can be stacked on each other. Siloxanes are particularly well suited to molding on the micron and submicron scales forming stable patterns (structures) with high aspect ratio and facile release properties.

Instead of putting pre-fabricated Siloxane onto the OLED, one may likewise cover the OLED with a viscous Siloxane composition that can be cured using ultraviolet radiation, as for example described in U.S. Pat. No. 5,063,102. If a curable Siloxane composition is used, excessive heating of the OLED is avoided. This case is particularly desirable for micromolding or embossing where the optical element, e.g. a light bending element, and the encapsulant are formed on the device in a single manufacturing step.

A first embodiment of the present invention is illustrated in FIG. 1. A discrete organic light emitting device 10 is shown. It comprises an electrode 12 (cathode) situated on a substrate 11. On top of the electrode 12 a stack of three organic layers 13–15 is situated. The organic layer 13 serves as electron transport layer (ETL) and the organic layer 15 serves as hole transport layer (HTL). The organic layer 14 which is embedded between the two transport layers 13 and 15 serves as electroluminescent layer (EL). In the following, the stack of organic layers will be referred to as organic region, for sake of simplicity. In the present embodiment, the organic region carries the reference number 19. On top of the HTL 15, a topelectrode (anode) 16 is formed. The uppermost surface of the device 10 is sealed by a Siloxane film 17. This film 17 conforms to the device 10. In the present example, the optical element embedded in the encapsulant 17 is a lens 18. Siloxane may also be used to cover and protect cathode-up structures.

Figure 2:
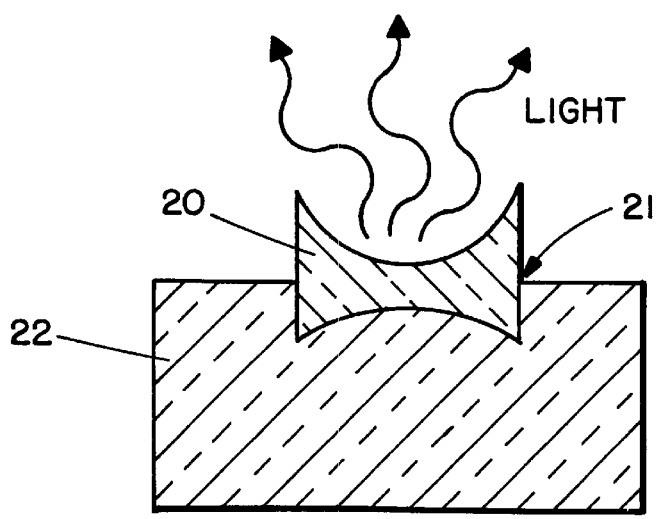
FIG. 2 shows a schematic cross-section of a a Siloxane encapsulant, according to the present invention, comprising a pocket-like portion carrying a lens.

Such a lens 18 can be a discrete optical element, which is embedded in the encapsulant 17 (as shown in FIG. 1). Likewise, a lens 20 may be placed in a pocket-like section 21 of an encapsulant 22, as schematically illustrated in FIG. 2. In order to further simplify the packaging and in order to reduce the costs, a lens might be directly formed in the Siloxane by means of embossing, for example (see FIG. 3). Here a second layer of Siloxane with a higher refraction index can be added to enhance the lensing.

Figure 3:
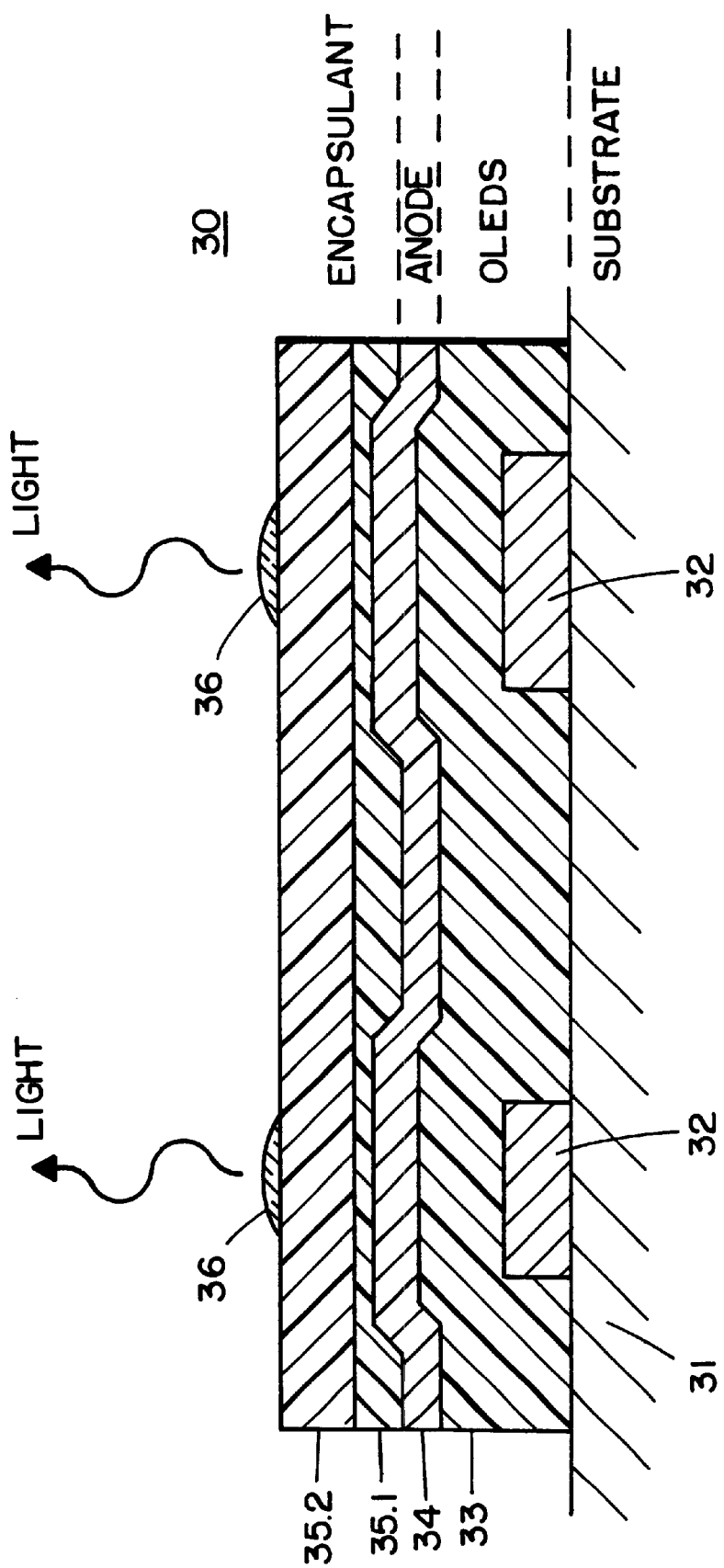
FIG. 3 shows a cross-section of a display or array, according to the present invention, comprising two Siloxane layers serving as encapsulants.

A second embodiment is illustrated in FIG. 3. In this Figure, a cross-section of an organic light emitting array 30 is shown. On top of a common substrate 31, cathodes 32 are patterned such that each of the light emitting diodes of the array 30 can be individually addressed. For sake of simplicity, the organic light emitting diodes are depicted as a dark grey layer 33. The layer 33 may comprise a stack of organic layers, for example. On top of the organic layer 33, a transparent or semi-transparent anode 34 is formed. In order to planarize the array 30, a curable Siloxane encapsulant is poured over the top of the array. By exposure of the Siloxane to ultraviolet light, a thin Siloxane layer 35.1 is formed. This layer 35.1 encapsulates the array 30 and provides for a planarized top surface.

In a next step, a Siloxane film 35.2, comprising embossed lenses 36, is applied. This Siloxane film 35.2 may for example be rolled onto the array 30. The Siloxane film 35.2 and the Siloxane layer 35.1 adhere to each other. The lenses 36 are aligned to the diodes of the array 30 such that light emitted by the diodes passes through the anode 34, the Siloxane 35.1 and 35.2 and the lenses 36 before being emitted into the halfspace above the array 30. In the present arrangement, the size of each of the diodes of the array 30 is mainly defined by the shape of the cathodes 32. It is to be noted, that the present invention is also suited for cathode-up structures.

Figure 4:
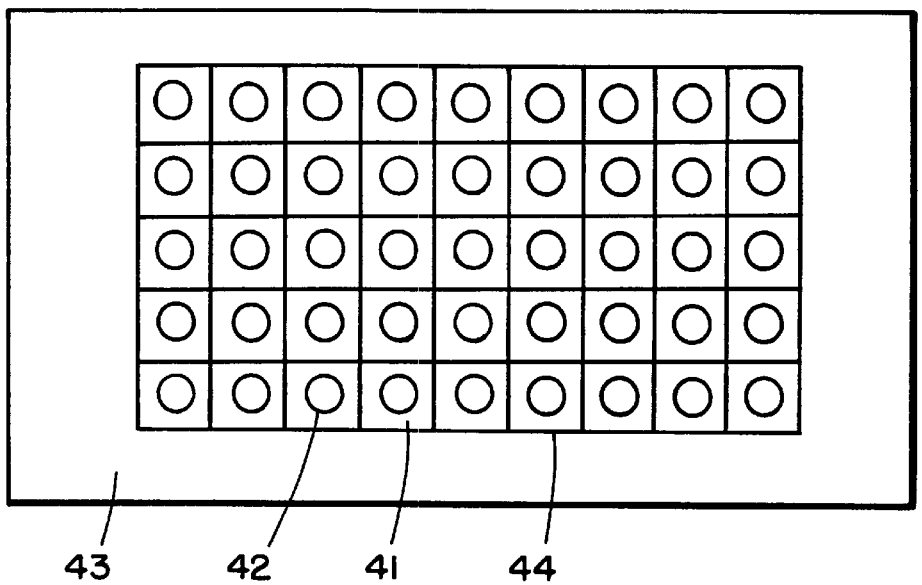
FIG. 4 shows a top-view of a display or array, according to the present invention, comprising a Siloxane film having a matrix of lenses.

In FIG. 4, another embodiment is illustrated. Shown is the top view of an organic display 40. Only the uppermost layer 43 of this display 40 is visible in FIG. 4. The display 40 comprises 9×5 rectangular pixels 41. Part of the display's surface is covered and encapsulated by a Siloxane film 44. The Siloxane film 44 carries a matrix of lenses 42. The film 44 is laterally aligned such that the lenses 42 are aligned with respect to the pixels 41 such that light is emitted through the lenses 42. Either micro or macro lenses may be employed to improve the directionality of the light emitted, or to focus the light. Focussing is for example required in a head mounted display. A Siloxane film with macro lenses could be applied to a conventional organic light emitting display to focus the light of the display on the viewer's eye(s). A Siloxane film with integrated optical elements, according to the present invention, eliminates the need for separate optics and combines the encapsulant with essential device operational items. It can be aligned with respect to the organic device underneath, using an alignment scheme as described in the co-pending PCT patent application "Stamp for a Lithographic Process", application No. PCT/IB95/00609, filed on Aug, 4, 1995, for example.

Figure 5:
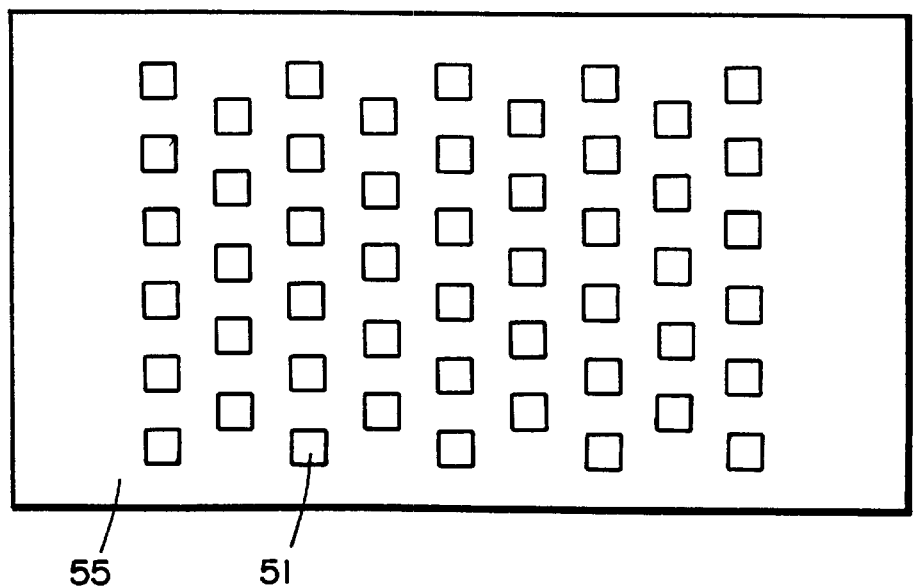
FIG. 5 shows a top-view of a conventional display or array.
Figure 6:
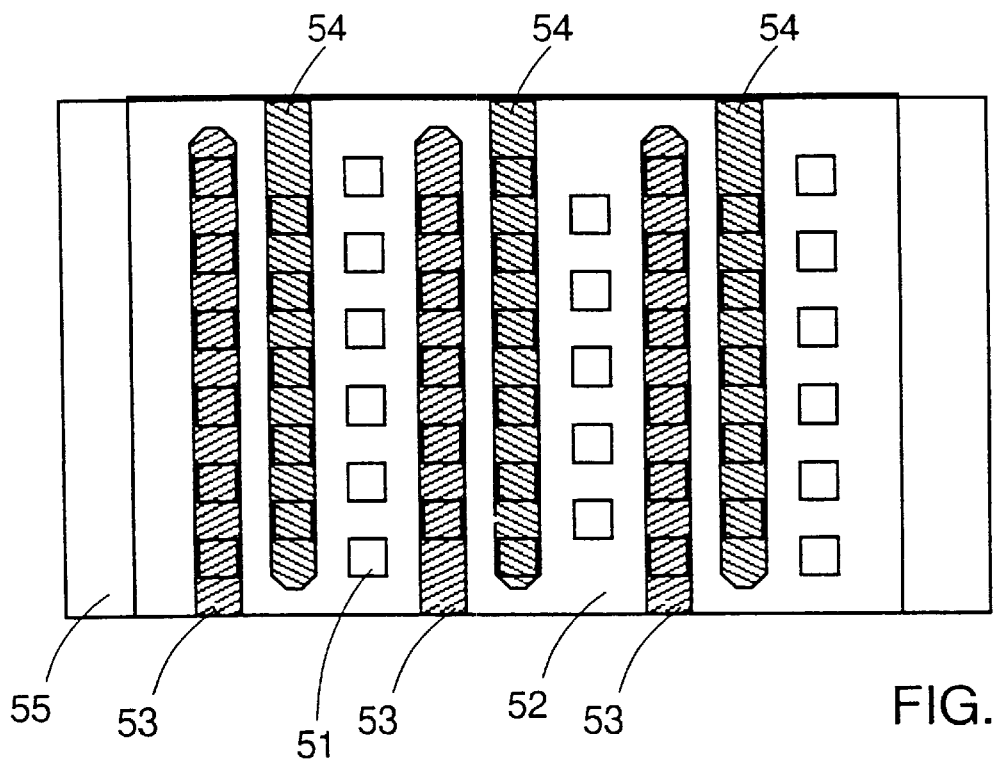
FIG. 6 shows a top-view of the display or array of FIG. 5, comprising a Siloxane film having a pathways filled with color conversion dyes, according to the present invention.

Another organic display embodiment 50 is illustrated in FIG. 5. As in FIG. 4, only the uppermost layer 55 of the display 50 is shown. The display comprises 9 columns and 11 rows of rectangular pixels 51. The display 50 is designed such that each pixel 51 emits white light if driven accordingly. In order to realize a multicolor display, usually color filters or color converters are employed. According to the present invention, no photolithographic steps with undesired chemicals are needed. In certain cases, photolithography can not be avoided for the definition of optical elements. In such a case, one may deposit or form a Siloxane encapsulation, before the photolithographic steps are carried out. This Siloxane layer then protects the organic device from the aggressive chemical photolithographic steps that may compromise the device. An appropriate color converter placed on top of the display 50 is illustrated in FIG. 6. Optical elements 53, 54 serving as color converters are integrated into a Siloxane film 52. Pathways 53 and 54 are provided in the Siloxane film 52 by micromolding or embossing the Siloxane. The depth of the pathways is designed around the color conversion material, but is typically in the range of 0.1 to 50 $\mu$m, and preferably between 1 and 15 $\mu$m. Instead of pathways, containers can be formed within the Siloxane which may have almost any form and size. The pathways 53 contain a first color converting dye and the pathways 54 contain another color converting dye. In the present example, the Siloxane film 52 is placed on top of the display 50 such that the first, fourth and seventh column of pixels is aligned to the pathways 53. The second, fifth and eights column of pixels is aligned to the pathways 54. By choosing appropriate color converting dyes, a three-color display can be realized.

Figure 7A:
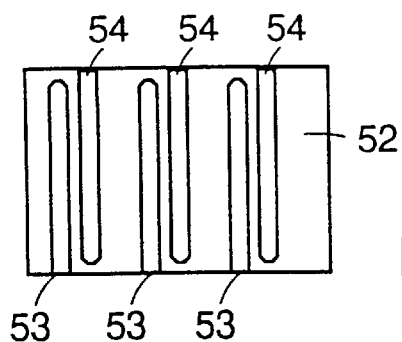
FIGS. 7A–C illustrates the fabrication of a Siloxane film, according to the present invention.
Figures 7B, 7C:
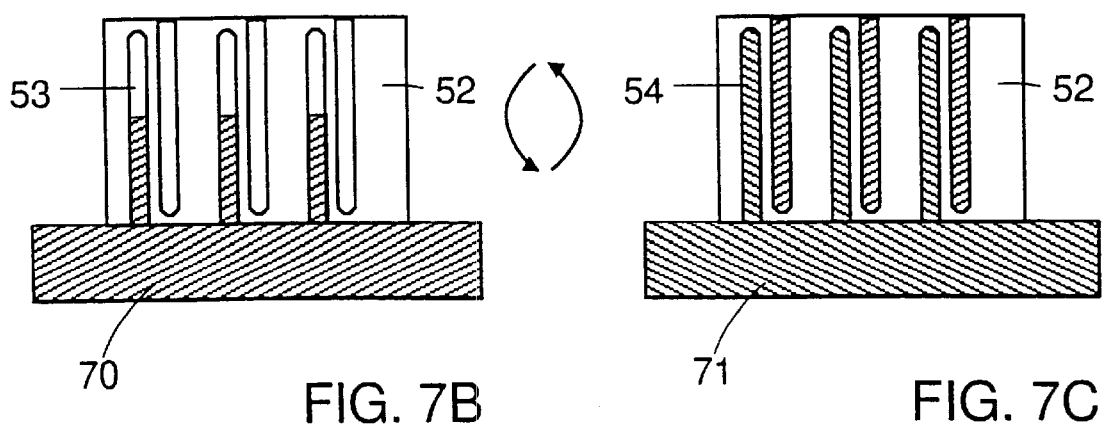

Such color converters can be easily made, as briefly described in the following. In FIG. 7A, a the Siloxane film 52 is shown which comprises a first set of pathways 53 and a second set of pathways 54. In order to fill the first set of pathways 53 with a color conversion dye giving green light, for example, one edge of the Siloxane film 52 may be dipped into a bath 70 comprising a suited dye, as shown in FIG. 7B. The dye is now automatically loaded into the pathways 53 by capillary action. If the first set of pathways 53 is filled, the Siloxane film 52 is flipped and the opposite edge is dipped into another bath 71 comprising another dye. By sealing the capillary opening with Siloxane, for example, the dye(s) can remain in a solution state, further enhancing spectral performance and efficiency of the color conversion dye. Likewise, one may allow the liquid to evaporate leaving the solid dye confined. By doing so, the second set of pathways 54 is filled with the dye contained in the second bath 71 (see FIG. 7C). The second dye may be a dye giving red. The dyes can remain a liquid within the pathways provided in the Siloxane film 52, or its solvents can drain away leaving the dye behind in a solid state.

By means of the above approach, a blue emitting organic array 50 may be patterned by red and green color converters thereby giving a full-color RGB (red, green, blue) display, as shown in FIG. 6.

A Siloxane film or encapsulant can be easily mass-fabricated. The respective fabrication steps can be carried out independently without having a detrimental effect on the more complicated OLED device.

Over a broad sheet of organic light emitters, patterns in a Siloxane film may be filled with color conversion dyes by capillary action so as to form multicolor static images. These images may be modified by replacement of the patterned Siloxane film with the encapsulated dye, or by a microfluidic manipulation of the color conversion dyes in the Siloxane pattern. The pathways in the Siloxane film are filled with immiscible liquids, each filled with a dye corresponding to the desired color. These pathways can then be filled or emptied by approximate application of pressure. or other means that causes the liquid to flow in or out of the pathways.

Depending on the composition and thickness of the Siloxane used, a flexible encapsulant can be obtained. Such a flexible encapsulant can be applied to organic light emitting devices being formed on a flexible substrate. It is possible, for instance, to realize flexible organic displays being protected by a flexible encapsulant.

Examples of optical elements that may be formed in, or embedded by the encapsulant are: lenses, filters, color converters, gratings, diffusers, polarizers, and prisms just to mention some examples. A mixture of color converters and attenuators may be brought into contact with, or formed on top of an organic multi-color light emitting array, in order to compensate for unequal efficiency of the light generation at different wavelengths. It is also feasible to form a Siloxane film comprising trapped bubbles. These bubbles serve as optical elements which interact with the light emitted by the OLED underneath. A lens can be easily formed by providing an empty bubble of well defined size and shape within the Siloxane. This can for example be achieved by embedding a sample of the respective size and shape in Siloxane. An appropriate sample should be chosen such that it can be easily removed later. It is conceivable to remove it using an etchant, or by solving it in a suitable solvent. Likewise, it may be removed mechanically.

To summarize, the above exemplary embodiments are fully compatible with any kind of organic light emitting devices, including polymeric, oligomeric, and small molecule OLED designs, or any hybrid design thereof.

What is claimed is:

1. A Siloxane film for protection of part of a light emitting portion of a contact electrode of an organic light emitting device having two contact electrodes, one thereof serving as anode and another thereof serving as cathode, and an organic region in which light is generated by means of electroluminescence if a voltage is applied between said two contact electrodes, wherein said Siloxane film includes within its structure an integral optical element designed to interact with light emitted by said organic light emitting device, wherein said optical element is selected from the group consisting of one or more of: a lens, a filter, a color converter, a grating, a prism, a bubble, a diffuser and a polarizer.

2. The Siloxane film of claim 1, wherein said optical element is either embedded in said Siloxane film, or formed in said Siloxane film, or placed in a pocket-like portion of said Siloxane film.

3. The Siloxane film of claim 1, comprising an array or matrix of optical elements.

4. The Siloxane film of claim 1, wherein said optical element is a color conversion element or color filter realized by a suited dye contained in said Siloxane film.

5. The Siloxane film of claim 4, wherein said dye is filled into container(s), preferably pathway(s), formed in said Siloxane.

6. The Siloxane film of claim 5, wherein said dye contained in said container(s) is either in its liquid state or in its solid state.

7. A Siloxane film for protection of part of a light emitting portion of a contact electrode of an organic light emitting device having two contact electrodes, one thereof serving as anode and another thereof serving as cathode, and an organic region in which light is generated by means of electroluminescence if a voltage is applied between said two contact electrodes, wherein said Siloxane film includes within its structure an integral optical element designed to interact with light emitted by said organic light emitting device, wherein said an integral optical element is selected from the group consisting of: a lens, filter, color converter, grating, prism, bubble, diffuser, polarizer and a combination thereof.

* * * * *